United States Patent
Hosokawa et al.

(10) Patent No.: US 7,190,238 B2
(45) Date of Patent: Mar. 13, 2007

(54) SURFACE MOUNTING CRYSTAL OSCILLATOR

(75) Inventors: Yasunori Hosokawa, Saitama (JP); Toru Yoshikawa, Saitama (JP); Heiji Takado, Saitama (JP)

(73) Assignee: Nihon Dempa Kogyo Co., Ltd., Tokyo (JP)

(*) Notice: Subject to any disclaimer, the term of this patent is extended or adjusted under 35 U.S.C. 154(b) by 129 days.

(21) Appl. No.: 11/156,416

(22) Filed: Jun. 20, 2005

(65) Prior Publication Data

US 2005/0285691 A1    Dec. 29, 2005

(30) Foreign Application Priority Data

Jun. 23, 2004    (JP)    .............................. 2004-184468

(51) Int. Cl.
*H03B 5/32*    (2006.01)

(52) U.S. Cl. ............ 331/158; 331/116 R; 331/116 FE; 331/68

(58) Field of Classification Search ................ 331/158, 331/116 FE, 116 R, 68
See application file for complete search history.

(56) References Cited

U.S. PATENT DOCUMENTS 5,949,294 A * 9/1999 Kondo et al. ................. 331/68

7,045,931 B2 * 5/2006 Yoshimine et al. ......... 310/322

FOREIGN PATENT DOCUMENTS

| JP | 09083248 | 3/1997 |
| JP | HEI9-83248 | 3/1997 |

OTHER PUBLICATIONS

European Patent Office Search Report dated Nov. 4, 2005.

* cited by examiner

*Primary Examiner*—Arnold Kinkead
(74) *Attorney, Agent, or Firm*—Scott D. Wofsy; Edwards Angell Palmer & Dodge LLP

(57) ABSTRACT

The present invention relates to a surface mounting crystal oscillator in which an IC chip, a crystal element, and a circuit component are connected together by wire bonding and are housed within a main container having a concave section. The main container has a pair of opposing inner wall step portions along both sides in the longitudinal direction, and this pair of inner wall step portions are also each divided into an upper step portion and a lower-step portion of different heights along the longitudinal direction. At least one of the upper step portions of the pair of inner wall step portions supports one end portion in the lengthwise direction of the crystal element so that the lengthwise direction of the crystal element is aligned in the widthwise direction of the main container. The circuit component is disposed on an inner base surface of the main container below the crystal element.

3 Claims, 3 Drawing Sheets

SURFACE MOUNTING CRYSTAL OSCILLATOR

BACKGROUND OF THE INVENTION

1. Field of the Invention

The present invention related to a crystal oscillator for surface mounting (hereinafter called a "surface-mounting oscillator") and, in particular, to a voltage-control type of surface-mounting oscillator of a lower profile in which the reliability thereof has been maintained.

2. Description of Related Art

Because surface-mounting oscillators are compact and light, they are often installed as frequency or time reference sources in portable electronic equipment, by way of example. Concomitant with the recent trend towards thinner electronic appliances has arisen a requirement for devices that are of a lower profile, particularly in the heightwise dimension thereof. One such device is disclosed in the patent document described below.

FIG. 2 is illustrative of a prior-art example of a surface-mounting oscillator, where FIG. 2A is a plan view with the cover removed and FIG. 2B is a vertical section therethrough.

This surface-mounting oscillator has a crystal element 2 and an IC chip 3 housed within a main container 1, and is sealed in and enclosed by a cover 4. The main container 1 is formed of a stack of ceramic layers that are rectangular in plan view and have a concave vertical section. Each end thereof in the longitudinal direction has an inner wall inner wall step portions 5, and there are mounting terminals on the outer surface thereof. It should be noted that the inner wall step portion 5 at one end is divided into two portions 5c and 5d, as shown on the left in FIG. 2A.

The crystal element 2 is of a rectangular shape, such as of an AT cut, by way of example. Each main surface thereof has an excitation electrode 6 with an extraction electrode 7 extending out in the lengthwise direction therefrom from one end portion, on opposite sides of the crystal element 2. An end portion extracted out from each extraction electrode 7 is affixed by an electrically-conductive adhesive 8 to one of the inner wall step portions 5 that has a crystal terminal (not shown). The crystal terminal is connected electrically to the IC chip 3 by an electrically conductive path.

The IC chip 3 integrates components such as an amplifier to form an oscillation circuit, and is disposed parallel to an inner base surface 1e of the main container 1, in close proximity thereto. The non-circuitry side of the IC chip 3 could be affixed to the inner base surface 1e of the main container 1 by an adhesive, by way of example. Bonding wires from IC terminals provided on both sides of the circuitry surface of the IC chip 3 connect to the inner wall step portion 5 at one end and a protruding portion 10. These are connected electrically to mounting terminals (not shown) provided on the outer surface. A capacitor 11a in chip form is provided as a circuit component in line with the IC chip 3. Note that this capacitor 11a is a discrete component because it has a large capacitance of at least 1000 picofarads (pF), making it difficult to integrate. In this case, it provides a bias between the power source and ground, by way of example.

With this surface-mounting oscillator, the crystal element 2, the IC chip 3, the other capacitor 11a are disposed in parallel on the inner base surface 1e of the main container 1. The heightwise dimension can therefore be made smaller, in comparison with a configuration in which the IC chip 3 and the capacitor 11a are disposes on the lower surface of the crystal element 2. This makes the device suitable for use as a surface-mounting oscillator to be installed in thinner electronic appliances. Since the IC chip 3 is connected to the inner wall step portion 5 and the protruding portion 10 by the bonding wires 9 (by a process called wire bonding), the reliability is greater than in configurations in which the connections are by means such as ultrasonic pressure welding using bumps. (See Japanese Patent Laid-Open Publication No. 9-83248.)

However, the above-described surface-mounting oscillator of the prior art raises a problem in that a device in which the heightwise dimension has been reduced has large external dimension in plan view, when configured as a voltage control oscillator, by way of example. In other words, a voltage control oscillator requires circuit components such as a voltage-variable capacitive component and inductor as discrete components (in chip form) that are difficult to integrate, in addition to the capacitor 11a. If these circuit components are disposed horizontally together with the crystal element 2 and the IC chip 3 (in the same plane therewith), the external dimensions in plan view will become greater, raising the problem that this configuration cannot be applied to this type of surface-mounting oscillator.

For that reason, the IC chip 3 and the circuit components such as the capacitor 11a, a voltage-variable capacitive component 11b, and an inductor 11c are disposed on an indented base surface of the main container 1, to form a surface-mounting oscillator in which one end portion of the crystal element 2 is held on the inner wall step portion 5. However, since the IC chip 3 (which is the tallest element, together with the bonding wires 9) and the crystal element 2 are disposed one on top of the other, a problem arises in that the heightwise dimension increases, as mentioned previously.

Note that the voltage-variable capacitive component 11b has a capacitance that changes with the control voltage, and varies the oscillation frequency. The inductor 11c causes the series resonance frequency of the crystal vibrator to decrease and broadens the expanse of anti-resonance frequencies with the series resonance frequency, thus broadening the amplitude variation of the oscillation frequency. That is why the inductor 11c is necessary in the voltage control oscillator. To allow for the increase the loop height of the bonding wires 9 (the allowance for deflection thereof), the IC chip 3 is usually the tallest component after packaging.

An objective of the present invention is to provide a surface-mounting oscillator which is highly reliable but with small dimensions in plan view and heightwise, and, in particular, a surface-mounting oscillator of a voltage control type.

SUMMARY OF THE INVENTION

The present invention relates to a surface mounting crystal oscillator in which an IC chip, a crystal element, and a circuit component are connected together by wire bonding and are housed within a main container having a concave section. The main container has a pair of opposing inner wall step portions along both sides in the longitudinal direction, and this pair of inner wall step portions are also each divided into an upper step portion and a lower-step portion of different heights along the longitudinal direction. At least one of the upper step portions of the pair of inner wall step portions supports one end portion in the lengthwise direction of the crystal element so that the lengthwise direction of the crystal element is aligned in the widthwise direction of the main container. The circuit component is disposed on an inner base surface of the main container below the crystal element. The IC chip is disposed on an inner base surface of the main container that is formed between the pair of lower-step portions of the pair of inner wall step portions, and bonding wires from the IC chip are connected to those lower-step portions.

This configuration ensures that the crystal element and the IC chip are disposed in parallel whereas the crystal element is disposed above the circuit component. The external dimensions in plan view can be reduced further than in a configuration in which the crystal element, the IC chip, and the circuit component are all in the same plane. Since the circuit component is disposed below the crystal element, the heightwise dimension can be made smaller, even when the IC chip is disposed by the wire bonding on the lower surface. Since the lengthwise dimension of the crystal element is disposed across the width of the main container, the longitudinal dimension of the main container can be reduced (See FIG. 1A).

In addition, the present invention ensures that one end portion of the crystal element is supported on the upper step portion with a pedestal of the same material as the crystal element interposed therebetween. This enables the coefficients of expansion of the crystal element and the pedestal to be the same. Warping due to differences in the coefficients of expansion can therefore be prevented, even when the crystal element is small and is aligned with the lengthwise dimension across the width of the main container, so that the vibrational characteristics can be maintained in a favorable manner.

In the present invention, the circuit component could be at least a voltage-variable capacitive component and an inductor. This makes it possible to obtain a surface-mounting oscillator that is suitable for voltage control.

BRIEF DESCRIPTION OF THE DRAWINGS

FIG. 1 is illustrative of an embodying example of a surface-mounting oscillator (voltage control type) in accordance with the present invention, where

FIG. 2 is illustrative of a prior-art example of a surface-mounting oscillator, where

DETAILED DESCRIPTION OF PREFERRED EMBODIMENT

Embodying Example

Figure 1A:
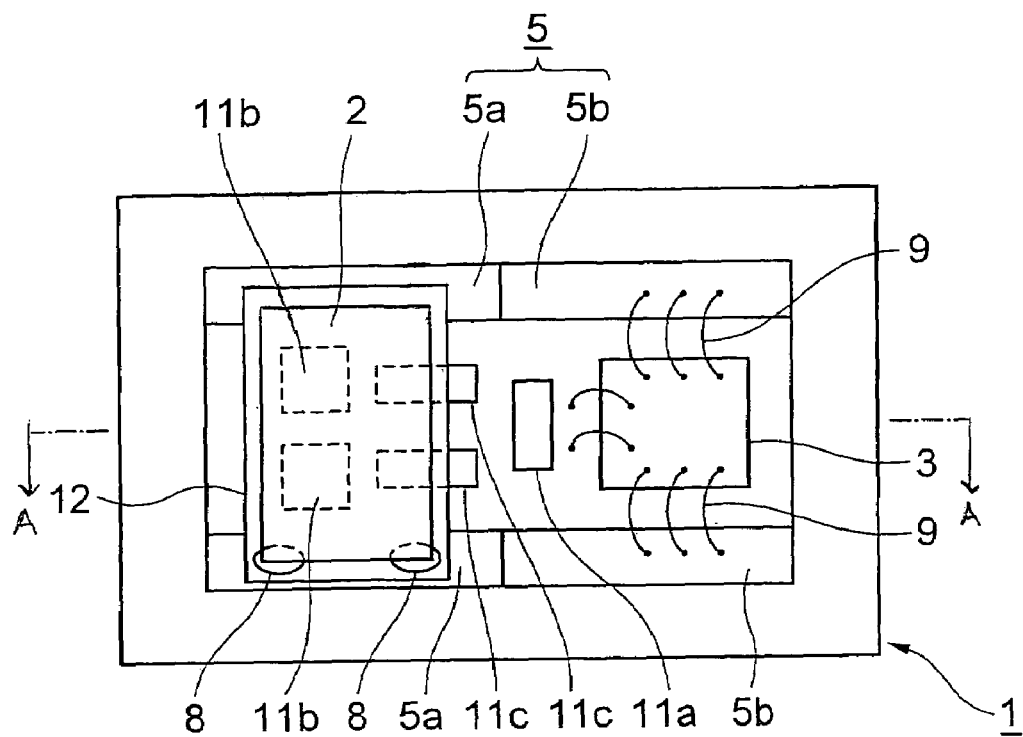
FIG. 1A is a plan view thereof with the cover removed and FIG. 1B is a section taken along the line A—A of FIG. 1A.
Figure 1B:
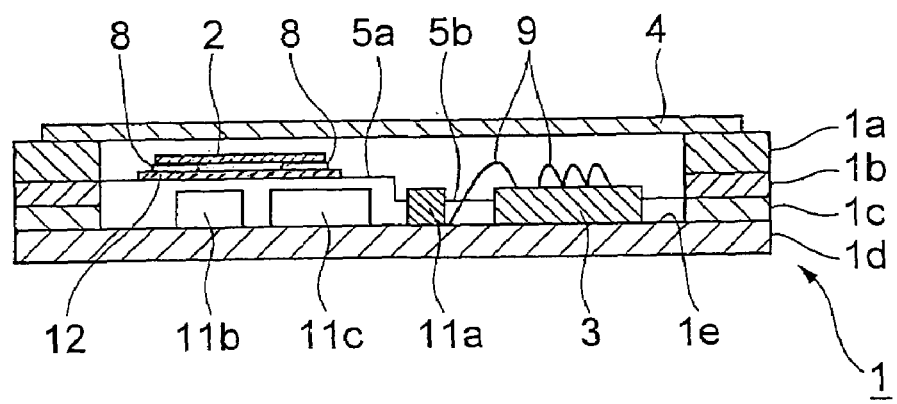
Figure 2A:
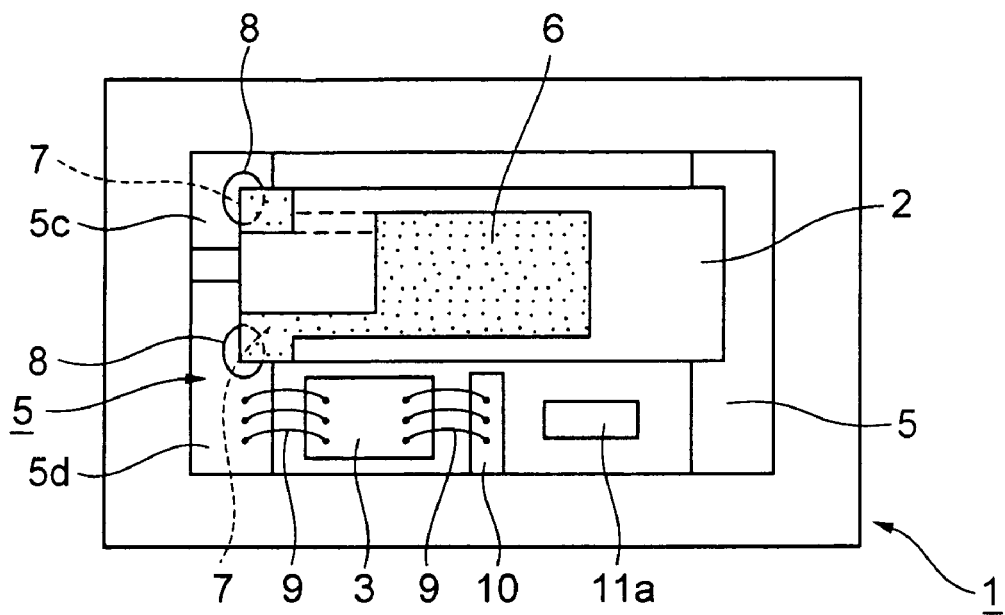
FIG. 2A is a plan view thereof with the cover removed and FIG. 2B is a vertical section therethrough.
Figure 2B:
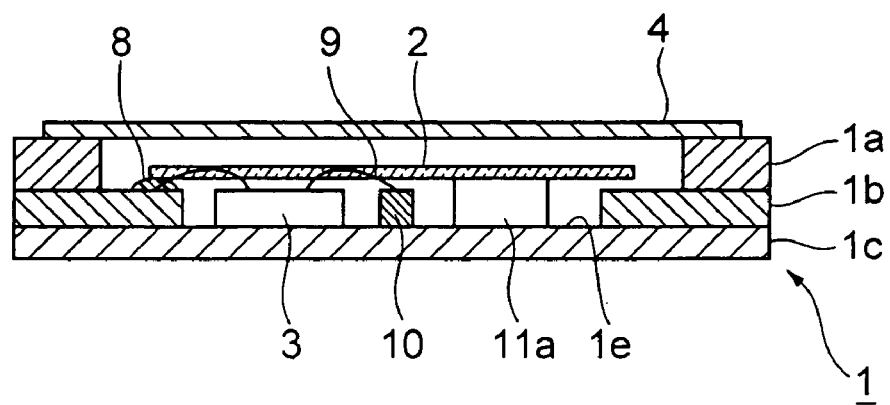
Figure 3:
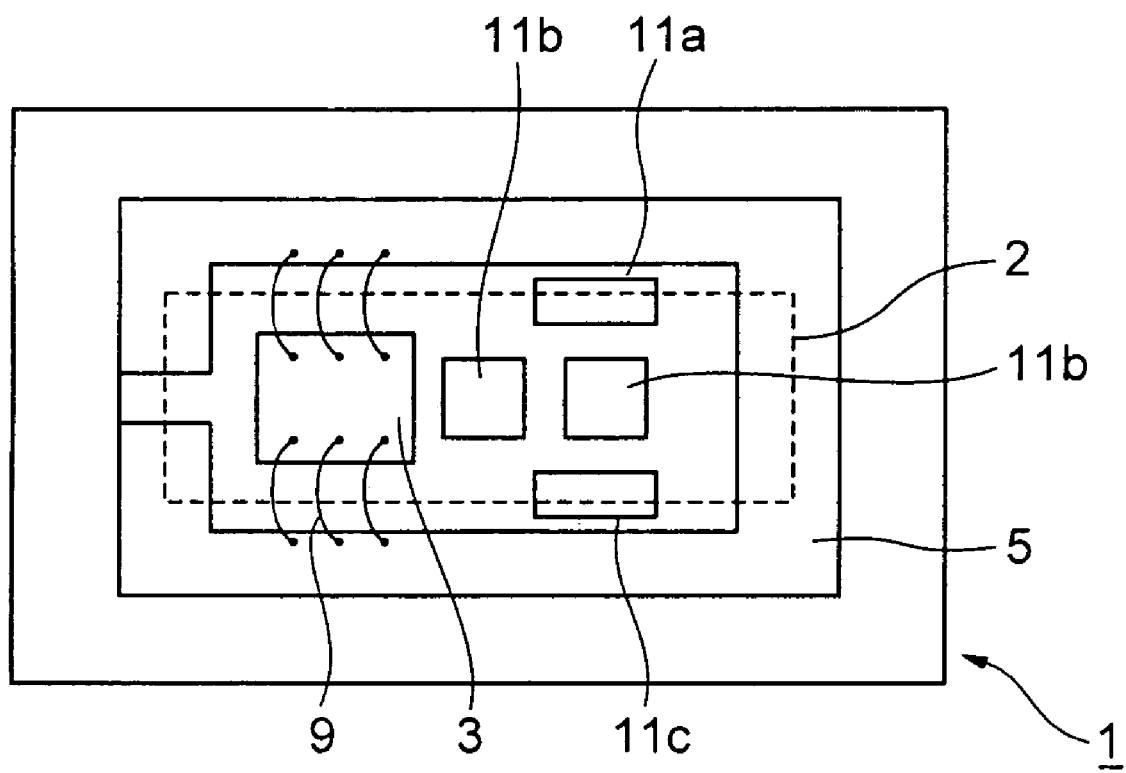
FIG. 3 is illustrative of a prior-art example of a surface-mounting oscillator with the cover removed.

An embodying example of a surface-mounting oscillator in accordance with the present invention is shown in FIG. 1, where FIG. 1A is a plan view thereof with the cover removed and FIG. 1B is a section taken along the line A—A of FIG. 1A.

The surface-mounting oscillator of the present invention is of a voltage control type. A crystal element 2 from which extraction electrodes (not shown) extend in the longitudinal direction on both sides of one end portion, a IC chip 3 in which at least an oscillation circuit is integrated and which is connected by wire bonding (bonding wires 9), and circuit components that are difficult to integrate (a capacitor 11a, a voltage-variable capacitive component 11b, and an inductor 11c) are accommodated within a main container 1 which is formed of a stack of ceramic layers 1a, 1b, 1c, and 1d in a concave form, and are sealed in and enclosed by a cover 4.

The main container 1 formed of the four-layer stack of ceramic layers 1 has a pair of inner wall step portions 5 along both side edges along the longitudinal direction thereof. Each of the pair of inner wall step portions 5 is formed of an upper step portion 5a and a lower-step portion 5b of different heights along the longitudinal direction. In this case, the height of the upper step portion 5a from the inner base surface is set to be higher than that of the circuit components but less than that of the IC chip 3 including the bonding wires.

Both sides of the crystal element 2 from which the extraction electrodes 7 extend are supported on the upper step portion 5a. That is to say, both sides of one of the end portions in the lengthwise direction of the crystal element 2 are supported as the widthwise of the main container 1.

In this case, two ends of a pedestal 12 formed of the same material as the crystal element 2 (AT cut) are affixed as a bridge between the pair of parallel upper step portions 5a. Both sides of one of the end portions of the crystal element 2 are affixed by an electrically-conductive adhesive 8 on top of the pedestal 12. There are crystal terminals on both sides of an end portion of the pedestal 12 for providing electrical connections with the extraction terminals, which are connected to the IC chip 3 by a wiring pattern (not shown).

The IC chip 3 is disposed (affixed) on an inner base surface 1e of the main container 1 that is formed between the pair of lower-step portions 5b. Bonding wires 9 from the circuitry surface (IC terminals) thereof are connected to those lower-step portions 5b of the inner wall step portions 5. The bonding wires 9 are also connected to a circuit pattern on the inner base surface.

The circuit components consist of the large-capacitance capacitor 11a, the voltage-variable capacitive component 11b for voltage control; and the inductor 11c that has a large frequency variable amplitude, which are difficult to integrate, as mentioned previously. The capacitor 11a and the inductor 11c are affixed to the inner base surface that becomes the lower surface of the crystal element 2 and the capacitor 11a is affixed to the inner base surface 1e between the crystal element 2 and the IC chip 3.

Note that there are two inductors 11c in this case. They are small-inductance devices connected in series to reduce the heightwise dimension. This is because a large-inductance element would also be taller, and thus the external dimensions would also increase.

Since this configuration ensures that the crystal element 2 and the IC chip 3 are disposed in parallel in the horizontal plane and the crystal element 2 is disposed above the circuit components 11a, 11b, and 11c, the external dimensions in plan view can be reduced further than in a configuration in which all the components are in the same plane. Incidentally, the external dimensions of the main container 1 can be made to conform to the existing standard of 7 mm×5 mm.

Since the circuit components 11a, 11b, and 11c are disposed below the crystal element 2, the heightwise dimension can be reduced further than in the configuration in which the IC chip 3 that is connected by wire bonding is disposed on the lower surface of the crystal element 2. In addition, since the lengthwise dimension of the crystal element 2 is disposed in the widthwise direction of the main container 1, the longitudinal dimension of the main container 1 can be reduced.

The crystal element 2 is also affixed by both end portions to the pedestal 12 that is formed of the same material (AT cut) thereof. Thus the coefficients of expansion of the pedestal 12 and the crystal element 2 are the same, so that warping of the crystal element 2 due to thermal shock can be eliminated. This makes it possible to obtain favorable vibration characteristics, even when the crystal element 2 is smaller and disposed with the lengthwise dimension thereof across the width of the main container 1.

This ensures that this embodying example of the surface-mounting oscillator in accordance with the present invention is highly reliable but has small dimensions both in plan view and heightwise, making it possible to obtain a surface-mounting oscillator that is particularly suitable as a voltage control device.

The embodying example of the present invention described above is of a voltage control type, but it should be obvious to those skilled in the art that the present invention can also be applied to other types of surface-mounting oscillator in which a large number of circuit components are disposed. In addition, the pedestal 12 was described as having both end portions affixed to the pair of upper step portions 5a, but the configuration could also be such that only one end portion thereof is affixed. Furthermore, the crystal element 2 was described as having both end portions thereof supported on the pedestal 12, but the configuration could also be such that the extraction electrodes 7 are extended from those two end portions and are supported thereon.

The pedestal 12 could be provided on only one of the upper step portions 5a, with both end portions of the crystal element 2 supported thereby. In such a case, since the coefficients of expansion of the pedestal 12 and the crystal element 2 are the same, the generation of warping due to thermal shock can be suppressed in a similar manner, retaining the favorable vibration characteristics. In addition, the pedestal 12 is not absolutely essential and it can be made unnecessary, depending on the specifications required thereof, such as frequency stability.

What is claimed is:

1. In a surface mounting crystal oscillator in which an IC chip, a crystal element, and a circuit component are connected together by wire bonding and are housed within a main container having a concave section; wherein said main container has a pair of opposing inner wall step portions along both sides in the longitudinal direction thereof, and also said pair of inner wall step portions are each divided into an upper step portion and a lower-step portion of different heights along the longitudinal direction; at least one of said upper step portions of said pair of inner wall step portions supports one end portion in the lengthwise direction of said crystal element so that the lengthwise direction of said crystal element is aligned in the widthwise direction of said main container; said circuit component is disposed on an inner base surface of said main container below said crystal element; and said IC chip is disposed on an inner base surface of said main container that is formed between said pair of lower-step portions of said pair of inner wall step portions, and bonding wires from said IC chip are connected to said lower-step portions.

2. The crystal oscillator, according to claim 1, wherein at least one end portion of said crystal element is supported on said upper step portion of said inner wall step portion with a pedestal of the same material as said crystal element interposed therebetween.

3. The crystal oscillator, according to claim 1, wherein said circuit component comprises at least a capacitor, a voltage-variable capacitive component, and an inductor.

* * * * *